(12) United States Patent
Rocha-Alvarez et al.

(10) Patent No.: US 10,161,035 B2
(45) Date of Patent: Dec. 25, 2018

(54) APPARATUS AND METHOD FOR PURGING GASEOUS COMPOUNDS

(71) Applicant: Applied Materials, Inc., Santa Clara, CA (US)

(72) Inventors: Juan Carlos Rocha-Alvarez, San Carlos, CA (US); Amit Kumar Bansal, Sunnyvale, CA (US); Ganesh Balasubramanian, Sunnyvale, CA (US); Jianhua Zhou, Campbell, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/016,870

(22) Filed: Feb. 5, 2016

(65) Prior Publication Data

US 2016/0222507 A1 Aug. 4, 2016

Related U.S. Application Data

(63) Continuation of application No. 14/036,170, filed on Sep. 25, 2013.
(Continued)

(51) Int. Cl.
*C23C 16/44* (2006.01)
*C23C 16/455* (2006.01)
(Continued)

(52) U.S. Cl.
CPC .... *C23C 16/4412* (2013.01); *C23C 16/45519* (2013.01); *C23C 16/45565* (2013.01);
(Continued)

(58) Field of Classification Search
CPC .......... C23C 16/4412; C23C 16/45519; F16L 53/001; H01L 21/67167
(Continued)

(56) References Cited

U.S. PATENT DOCUMENTS 5,780,360 A 7/1998 Tseng et al.
5,884,009 A * 3/1999 Okase ............... H01L 21/67115
219/405

(Continued)

FOREIGN PATENT DOCUMENTS

JP 2003277936 A 10/2003
JP 2004217956 A 8/2004
(Continued)

OTHER PUBLICATIONS

PCT International Search Report and Written Opinion dated Jan. 13, 2014, for International Application No. PCT/US2013/061581.

*Primary Examiner* — Kevin Murphy
*Assistant Examiner* — Paul J Gray
(74) *Attorney, Agent, or Firm* — Patterson + Sheridan LLP

(57) ABSTRACT

A processing chamber is described having a gas evacuation flow path from the center to the edge of the chamber. Purge gas is introduced at an opening around a support shaft that supports a heater plate. A shaft wall around the opening directs the purge gas along the support shaft to an evacuation plenum. Gas flows from the evacuation plenum through an opening in a second plate near the shaft wall and along the chamber bottom to an opening coupled to a vacuum source. Purge gas is also directed to the slit valve.

8 Claims, 2 Drawing Sheets

Related U.S. Application Data

(60) Provisional application No. 61/706,098, filed on Sep. 26, 2012.

(51) Int. Cl.
 F27D 7/02 (2006.01)
 F27D 7/06 (2006.01)
 H01J 37/32 (2006.01)

(52) U.S. Cl.
 CPC .............. F27D 7/02 (2013.01); F27D 7/06 (2013.01); H01J 37/3244 (2013.01); H01J 37/32834 (2013.01); H01J 2237/3321 (2013.01); Y10T 137/6416 (2015.04)

(58) Field of Classification Search
 USPC ............................................. 118/50, 52, 319
 See application file for complete search history.

(56) References Cited

U.S. PATENT DOCUMENTS

| | | | |
|---|---|---|---|
| 6,602,346 B1* | 8/2003 | Gochberg | H01L 21/67126 118/715 |
| 2006/0160359 A1 | 7/2006 | Kasai et al. | |
| 2007/0023728 A1* | 2/2007 | Ledo | F16K 3/0272 251/326 |
| 2009/0107955 A1* | 4/2009 | Tiner | C23C 16/4404 216/67 |
| 2010/0206231 A1* | 8/2010 | Yoon | H01J 37/32357 118/723 I |
| 2011/0214611 A1 | 9/2011 | Kato et al. | |

FOREIGN PATENT DOCUMENTS

| | | |
|---|---|---|
| JP | 2005109342 A | 4/2005 |
| KR | 20080095099 A | 10/2008 |
| KR | 20080095103 A | 10/2008 |
| KR | 1020100059238 | 6/2010 |

* cited by examiner

APPARATUS AND METHOD FOR PURGING GASEOUS COMPOUNDS

CROSS-REFERENCE TO RELATED APPLICATIONS

This application claims benefit of U.S. Non-Provisional patent application Ser. No. 14/036,170 filed Sep. 25, 2013 and U.S. Provisional Patent Application Ser. No. 61/706,098 filed Sep. 26, 2012, which are incorporated herein by reference.

BACKGROUND OF THE INVENTION

Field of the Invention

Embodiments of the present invention generally relate to an apparatus and method for purging gaseous compounds from a processing chamber.

SUMMARY OF THE INVENTION

The present invention generally relates to an apparatus and method for purging gaseous compounds from a chamber. Processing gas is pulled down below a heater plate by a vacuum pump. Purging gas is introduced through the slit valve as well as along the stem holding up the heater plate. The purge gas collectively directs the processing gas to flow towards the vacuum pump. In absence of the purge gas, the processing gas would recirculate rather than evacuate from the processing chamber.

DETAILED DESCRIPTION OF THE INVENTION

The present invention generally relates to an apparatus and method for purging gaseous compounds from a chamber. FIG. 1 shows an apparatus 100 comprising a processing chamber 102. Within the processing chamber 102, a gas distribution showerhead 104 is present that has a plurality of openings 105 therethrough to permit processing gas to pass through the showerhead 104. Substrates are inserted into and removed from the processing chamber 102 through a slit valve opening 106 formed through the chamber body. A heater plate 108 is disposed across the processing space 116 from the showerhead 104. The heater plate 108 is disposed on a support stem 126. Below the heater plate 108 is a second plate 110 that is spaced from the heater plate 108 by an evacuation plenum 120. Processing gas is delivered from a precursor gas source 112 for processing a substrate within the chamber 102. The gas travels from the source 112 into a plenum 114 where the gas is evenly distributed before passing through the openings 105 formed in the showerhead 104. The precursor gas travels along the path shows by arrows labeled "A".

Once in the processing area 116, the processing gas is exposed to the substrate (not shown) to process the substrate. The processing gas may be ignited into a plasma if desired. To leave the chamber 102, the processing gas is evacuated by a vacuum pump 124 through the bottom of the chamber 102. As shown in FIG. 1, the processing gas is drawn around the heater plate 108 through a gap 118 formed between the heater plate 108 and the chamber wall. The gas is drawn into the evacuation plenum 120 between the heater plate 108 and the second plate 110.

In order to ensure the processing gas flows out of the chamber and doesn't simply circulated around within the plenum 120, a purging gas is introduced from a purge gas source 122. The purging gas is introduced from two locations. The first location is from the bottom of the chamber 102 between the stem 126 and a shaft wall 128. The purging gas flows along a path identified by arrows "B". The purging gas flows up between the stem 126 and the shaft wall 128 and emerges from an opening 130 into the plenum 120. Additionally, purging gas is introduced from a second location, within the slit valve opening 106. The purge gas from the slit valve opening 106 flows along a path identified by arrows "C" into the plenum 120. As shown, the purge gases and processing gas collectively flow within the plenum towards an opening 132 formed in the second plate 110 and into the bottom plenum 134 and out of the chamber 102 through the vacuum pump 124.

FIG. 2 is a schematic illustration of the gas flow within the apparatus of FIG. 1 when introducing purging gas. As can be seen from FIG. 2, the processing gas mixes well with the purging gas and generally flows towards opening 132 in plate 110. Contrasting with FIG. 3, FIG. 3 is a schematic illustration of the gas flow within the apparatus of FIG. 1 without the purge gas flow. As shown in FIG. 3, when no purging gas is introduced, the processing gas recirculates within plenum 120.

Thus, by introducing purge gas through the bottom of the chamber, together with purge gas from the slit valve opening, processing gas can effectively be evacuated from a processing chamber through the bottom of the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
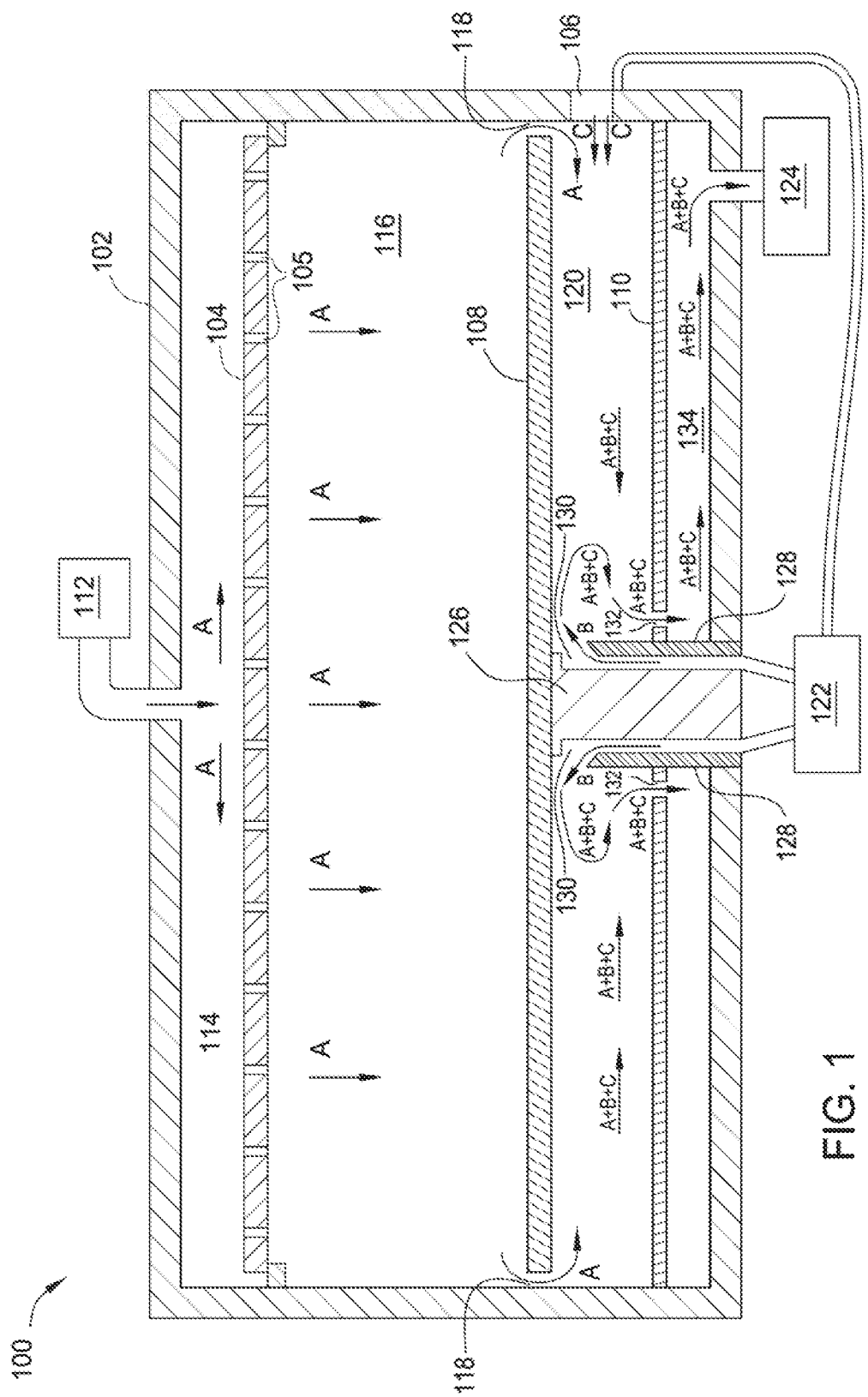
FIG. 1 is a schematic cross-sectional illustration of an apparatus according to one embodiment.
Figure 2:
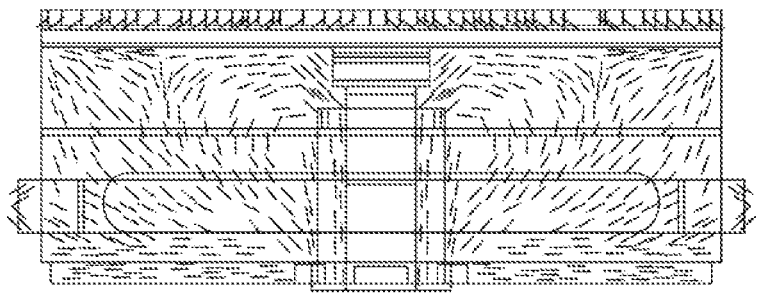
FIG. 2 is a schematic illustration of the gas flow within the apparatus of FIG. 1 when introducing purging gas.
Figure 3:
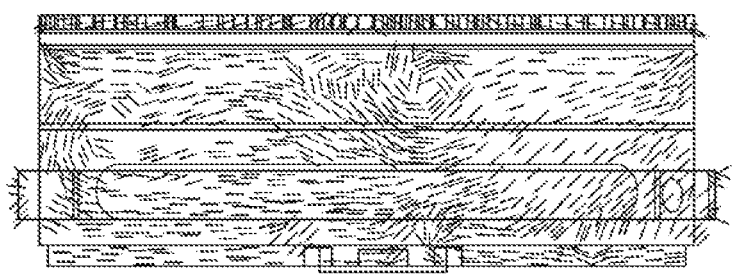
FIG. 3 is a schematic illustration of the gas flow within the apparatus of FIG. 1 without the purge gas flow.

While the foregoing is directed to embodiments of the present invention, other and further embodiments of the invention may be devised without departing from the basic scope thereof, and the scope thereof is determined by the claims that follow.

We claim:

1. An apparatus for processing a substrate, comprising:
   a chamber body with a side wall and a bottom wall;
   a heater plate disposed on a support stem extending through the bottom wall;
   a shaft wall surrounding the support stem, wherein the shaft wall has a first end coupled to the chamber bottom and a second end distal from the first end;
   a gas distribution showerhead opposite the heater plate;
   a processing area defined by the heater plate, the gas distribution showerhead, and the side wall;
   a second plate between the heater plate and the bottom wall, the second plate having an opening proximate to the shaft wall,
   wherein the opening is disposed between the heater plate and the bottom wall, wherein the second plate is directly attached to the side wall and directly attached to the shaft wall at an attachment location between the first end and the second end so that at least a portion of the shaft wall extends between the attachment location and the second end, and wherein the heater plate, the second plate, the shaft wall, and the sidewall define a precursor gas evacuation plenum which is in fluid communication with the processing area through a gap between the heater plate and the sidewall;

a bottom plenum defined by the second plate, the shaft wall, the side wall, and the bottom wall, wherein the bottom plenum is in fluid communication with the precursor gas evacuation plenum through the opening in the second plate; and a pumping port disposed through the bottom wall, wherein the pumping port is located below the second plate and radially inward of the side wall, wherein the pumping port is in fluid communication with the bottom plenum, and wherein the shaft wall and the support stem define a purge gas flow pathway from a first purge gas inlet disposed through the bottom wall into the precursor gas evacuation plenum.

2. The apparatus of claim 1, wherein the pumping port is located near the side wall of the chamber body.

3. The apparatus of claim 1, wherein the gas flow pathway further comprises the opening near the shaft wall.

4. The apparatus of claim 1, further comprising a slit valve opening disposed through the sidewall, the slit valve opening having a second purge gas inlet.

5. The apparatus of claim 4, wherein the slit valve opening is located in the side wall of the chamber below the heater plate when the heater plate is in a processing position.

6. An apparatus for processing a substrate, comprising:
a chamber body with a side wall and a bottom wall;
a heater plate disposed on a support stem extending through the bottom wall;
a shaft wall surrounding the support stem, wherein the shaft wall has a first end coupled to the chamber bottom and a second end distal from the first end;
a gas distribution showerhead opposite the heater plate;
a processing area defined by the heater plate, the gas distribution showerhead, and the side wall;
a second plate between the heater plate and the bottom wall, the second plate having an opening proximate to the shaft wall,
wherein the opening is disposed between the heater plate and the bottom wall,
wherein the second plate is directly attached to the side wall and coupled to the shaft wall at a coupling location between the first end and the second end thereof so that at least a portion of the shaft wall extends between the coupling location and the second end, and
wherein the heater plate, the second plate, the shaft wall, and the sidewall define a precursor gas evacuation plenum which is in fluid communication with the processing area through a gap between the heater plate and the sidewall;
a bottom plenum defined by the second plate, the shaft wall, the side wall, and the bottom wall, wherein the bottom plenum is in fluid communication with the precursor gas evacuation plenum through the opening in the second plate; and
a pumping port disposed through the bottom wall,
wherein the pumping port is located below the second plate and radially inward of the side wall,
wherein the pumping port is in fluid communication with the bottom plenum, and
wherein the shaft wall and the support stem define a purge gas flow pathway from a first purge gas inlet disposed through the bottom wall directly into the precursor gas evacuation plenum.

7. The apparatus of claim 6, wherein the gap between the heater plate and the side wall forms a precursor gas flow pathway from the processing area to the evacuation plenum.

8. The apparatus of claim 6, wherein the heater plate, the shaft wall, the side wall, and the second plate define a first plenum, wherein the shaft wall, the side wall, the bottom, and the second plate define a second plenum, and wherein the first plenum is in fluid communication with the second plenum through the second opening.

* * * * *